(12) United States Patent
Shousha et al.

(10) Patent No.: US 10,784,851 B2
(45) Date of Patent: Sep. 22, 2020

(54) POWER SWITCHING DEVICE AND METHOD TO OPERATE SAID POWER SWITCHING DEVICE

(71) Applicant: Würth Elektronik eiSos GmbH & Co. KG, Waldenburg (DE)

(72) Inventors: Mahmoud Shousha, Eching (DE); Martin Haug, Munich (DE)

(73) Assignee: WÜRTH ELEKTRONIK EISOS GMBH & CO. KG, Waldenburg (DE)

( * ) Notice: Subject to any disclaimer, the term of this patent is extended or adjusted under 35 U.S.C. 154(b) by 0 days.

(21) Appl. No.: 16/493,388

(22) PCT Filed: Mar. 9, 2018

(86) PCT No.: PCT/EP2018/055909
§ 371 (c)(1),
(2) Date: Sep. 12, 2019

(87) PCT Pub. No.: WO2018/166912
PCT Pub. Date: Sep. 20, 2018

(65) Prior Publication Data
US 2020/0136602 A1    Apr. 30, 2020

(30) Foreign Application Priority Data
Mar. 15, 2017 (EP) ..................... 17161130

(51) Int. Cl.
*H03K 17/689* (2006.01)
*H03K 17/691* (2006.01)
*H02M 1/08* (2006.01)
*H02M 3/335* (2006.01)
*H03K 17/082* (2006.01)

(52) U.S. Cl.
CPC . *H03K 17/0822* (2013.01); *H03K 2217/0081* (2013.01)

(58) Field of Classification Search
CPC .................. H03K 17/0822; H03K 2217/0081
See application file for complete search history.

(56) References Cited

U.S. PATENT DOCUMENTS

| 4,461,966 A | 7/1984 | Hebenstreit |
| 5,019,719 A | 5/1991 | King |

(Continued)

FOREIGN PATENT DOCUMENTS

| DE | 30 45 771 A1 | 7/1982 |
| DE | 103 12 704 A1 | 9/2004 |
| WO | 2015/016891 A1 | 2/2015 |

*Primary Examiner* — Kenneth B Wells
(74) *Attorney, Agent, or Firm* — McGlew and Tuttle, P.C.

(57) ABSTRACT

A power switching device includes a buffer circuit, a filter circuit, a transformer, a restoration circuit, a conditioning circuit and a power switch. The buffer circuit provides a unipolar buffer output voltage dependent on an input voltage and a control voltage. The filter circuit blocks a direct component of the buffer output voltage which is added on the secondary side of the transformer by the restoration circuit. The power switch is controlled by a unipolar conditioning voltage provided by the restoration circuit to the conditioning circuit. The power switching device acts as a plug and play module and can be used and operated in a flexible and easy manner.

20 Claims, 3 Drawing Sheets

(56) References Cited

U.S. PATENT DOCUMENTS

| | | | |
|---|---|---|---|
| 7,236,041 B2* | 6/2007 | Kim | H02M 1/08 |
| | | | 327/110 |
| 8,184,457 B2* | 5/2012 | Chen | H02M 1/32 |
| | | | 323/222 |
| 9,391,510 B2* | 7/2016 | Wimpenny | H02M 1/08 |
| 9,966,837 B1* | 5/2018 | Seaton | H02M 3/155 |
| 2003/0164721 A1 | 9/2003 | Reichard | |
| 2009/0147544 A1 | 6/2009 | Melanson | |
| 2011/0019454 A1* | 1/2011 | Fotherby | H02M 1/08 |
| | | | 363/132 |
| 2011/0285447 A1* | 11/2011 | Nakanishi | H03K 5/08 |
| | | | 327/326 |
| 2014/0367563 A1 | 12/2014 | Zhong et al. | |

* cited by examiner

POWER SWITCHING DEVICE AND METHOD TO OPERATE SAID POWER SWITCHING DEVICE

CROSS REFERENCE TO RELATED APPLICATIONS

This application is a United States National Phase Application of International Application PCT/EP2018/055909 filed Mar. 9, 2018 and claims the benefit of priority under 35 U.S.C. § 119 of European Patent Application, Serial No. EP 17 161 130.4, filed on Mar. 15, 2017, the entire contents of which are incorporated herein by reference.

FIELD OF THE INVENTION

The invention relates to a power switching device and a method to operate said power switching device.

BACKGROUND OF THE INVENTION

U.S. Pat. No. 4,461,966 A (corresponds to DE 30 45 771 A1) discloses a circuit for controlling at least one power FET. A unipolar input voltage is applied from a controller to input terminals. The input voltage is differentiated. The resulting bipolar voltage appears due to a transformer as an output voltage at the secondary side of the transformer. The positive pulse of the output voltage arrives at the gate electrode through a diode and charges up the input capacitance of the FET. In this way the FET is switched on. Simultaneously a capacitor is charged up through a Zener diode. Due to the following negative pulse the Zener diode breaks down and the capacitor is discharged such that a transistor connected in parallel to the input capacitance is opened. As a result the input capacitance is discharged and the FET is blocked. The known circuit has the disadvantages that the level of the driving voltage of the FET is dependent on the duty cycle of the input voltage and that the controller has to provide the required power to operate the circuit.

US 2014/0367563 A1 discloses an isolation driving circuit to drive a MOSFET.

US 2003/0164721 A1 discloses a driver circuit to provide control signals to a high-power switching transistor, namely an IGBT.

U.S. Pat. No. 5,019,719A discloses a drive circuit for driving a power MOSFET. The power MOSFET is driven by providing an auxiliary voltage across a capacitor which is connected in parallel to a resistor. The capacitor is charged and discharged by two low power MOSFET transistors and the resistor.

SUMMARY OF THE INVENTION

An object of the present invention is to provide a power switching device which can be used and operated in a flexible and easy manner. In particular, it is an object of the invention to provide a power switching device which is configured as plug and play module and can easily be installed.

This object is achieved by a power switching device comprising a first input terminal to apply an input voltage from a power stage, a second input terminal to apply a control voltage from a controller, a buffer circuit to provide a buffer output voltage dependent on the input voltage and the control voltage, a filter circuit to block a direct component of the buffer output voltage and to provide a primary side voltage, a transformer to transform the primary side voltage into a secondary side voltage, a restoration circuit to at least partially add the blocked direct component to the secondary side voltage and to provide a conditioning voltage, a conditioning circuit to provide a driving signal dependent on the conditioning voltage, and a power switch connected to a first output terminal and a second output terminal, which is controlled by the driving signal. The inventive power switching device integrates a buffer circuit, a filter circuit, a transformer, a restoration circuit, a conditioning circuit and a power switch to act as a plug and play module which can operate in various applications without worrying about the way the power switching device is connected to a controller and/or to a power stage. An input voltage from a power stage is applied by means of the first input terminal to the buffer circuit. Accordingly a control voltage from a controller is applied via a second input terminal to the buffer circuit. The controller may provide a positive unipolar control voltage or a negative unipolar control voltage or an alternating control voltage. Hence, the power switching device can be operated with a standard available controller, in particular with a simple controller which provides a unipolar control voltage. Preferably, the power switching device comprises a third input terminal. The third input terminal provides a reference node. The third input terminal is in particular connected with a common ground of the power stage and the controller. The buffer circuit provides the buffer output voltage which depends on the input voltage and the control voltage. The buffer output voltage corresponds to the control voltage and is unipolar or bipolar. Due to the buffer circuit the controller is not affected by the required power because the required power is provided by the power stage. Preferably, the buffer circuit is connected with the third input terminal. The filter circuit is designed to block a direct component of the buffer output voltage and to provide an alternating primary side voltage. Input terminals of the filter circuit are connected to output terminals of the buffer circuit. The filter circuit acts as a low-cut filter. Preferably, the filter circuit interacts with the primary side winding of the transformer. Dependent on the transformation ratio the alternating primary side voltage is transformed into an alternating secondary side voltage by the transformer. Furthermore, due to the transformer the secondary side is isolated from the primary side. The restoration circuit is arranged at the secondary side. By means of the restoration circuit the control voltage is reconstructed on the secondary side of the transformer without affecting its duty cycle or frequency. The restoration circuit is designed such that the blocked direct component is at least partially added to the alternating secondary side voltage in order to provide a unipolar conditioning voltage. By adding the blocked direct component a level of the driving voltage of the power switch is independent from the duty cycle of the control voltage. The duty cycle is the ratio of a pulse duration and a switching period. Therefore, the duty cycle is also called duty ratio. The conditioning voltage has two voltage levels. Dependent on the voltage level the conditioning circuit controls a driving current. For example, at a first voltage level the driving current charges an internal capacitance of the power switch, whereas at a second voltage level the driving current discharges the internal capacitance of the power switch. The internal capacitance of the power switch provides a driving voltage such that the power switch is switched on and switched off. The charged internal capacitance provides a first level of the driving voltage such that the power switch is switched on and the discharged internal capacitance provides a second level of the driving voltage such that the power switch is switched off. Preferably, the power switch is a MOSFET, in particular a n-channel MOSFET. In this case the internal capacitance is a gate-source-capacitance and the driving voltage is a gate-source-voltage. Alternatively, the power switch is a bipolar junction transistor (BJT) or an insulated gate bipolar transistor (IGBT). In case of a bipolar junction transistor the driving voltage is a base-emitter signal, in particular a base-emitter voltage. The output terminals are connected to the power switch. For example, the output terminals are connected to drain and source of the MOSFET or to emitter and collector of the bipolar junction transistor.

By means of the restoration capacitor a direct component is added to the alternating secondary side voltage. Due to this added direct component the output voltage of the restoration circuit or the conditioning voltage becomes unipolar. By the unipolar conditional voltage the level of the driving voltage is independent of the duty cycle of the control voltage. The blocking element is connected in parallel to a series connection of the secondary side winding and a restoration capacitor. The blocking element is a diode. Preferably, a series connection of the restoration capacitor and the secondary side winding is connected to a node $N_2$ and a node $N_3$. The restoration capacitor is connected to the node $N_2$, whereas the secondary side winding is connected to the node $N_3$. A diode is connected to the node $N_2$ and the node $N_3$. The diode is connected such that a flow direction of the diode is directed from the node $N_3$ to the node $N_2$. The diode allows a current flow from the node $N_3$ to the node $N_2$. The blocking element enables a unipolar conditioning voltage at the output of the restoration circuit. Additionally, due to the blocking function the blocking element reduces the driving losses.

The switch-on-circuit serves to switch on the power switch, whereas the switch-off-circuit serves to switch-off the power switch. The switch-on-circuit works at a first voltage level of the conditioning voltage, whereas the switch-off-circuit works at a second voltage level of the conditioning voltage. When the conditioning voltage has a first voltage level, the blocking element allows a flow of a driving current such that the power switch is switched on. The blocking element is a diode. The blocking element of the switch-on-circuit and the blocking element of the filter circuit are preferably operated in common. If both blocking elements are designed as diodes, these diodes have the same flow direction. Preferably, the blocking element is connected in series to a resistor. Preferably, a series connection of a diode and a resistor is connected to a node $N_2$ and to the power switch, in particular to a gate terminal of a MOSFET. Preferably, the flow direction of the diode is directed from the node $N_2$ to the power switch. For example, the power switch is a MOSFET and the driving signal is a driving current through the blocking element such that an internal capacitance of the MOSFET, namely a gate-source-capacitance is charged by the driving current. The gate-source-capacitance provides a driving voltage which switches on the power switch. In particular, the first voltage level is not equal to zero.

When the conditioning voltage has a second voltage level the control switch has a switching state such that the power switch is switched off. Preferably, the control switch is a bipolar junction transistor. For example, the control switch is switched on when the second voltage level is zero and the driving current discharges an internal capacitance of the power switch such that the power switch is switched off. The switch-off-circuit comprises exactly one control switch, which is in particular a bipolar junction transistor. Preferably, the bipolar junction transistor is a PNP bipolar junction transistor. Preferably, a collector terminal of the control switch is connected to a source terminal of the power switch, whereas an emitter terminal of the control switch is connected to a gate terminal of the power switch. Preferably, a bias terminal of the control switch is connected to a resistor which is connected to a node $N_2$. Preferably, the source terminal of the power switch and the collector terminal of the control switch are connected to a node $N_3$.

Since the internal capacitance is comparatively small, switching on and switching off of the power switch happens quickly by charging or discharging the internal capacitance. Therefore, the power switching device enables a high switching frequency.

A power switching device wherein the filter circuit comprises a filter capacitor and a filter resistor, which are in particular connected in series ensures a flexible and easy use and operation. To act as a low-cut filter the filter circuit comprises a filter capacitor and a filter resistor. Preferably, the filter capacitor and the filter resistor are connected in series and interact with the primary side winding of the transformer. The filter circuit enables blocking of the direct component of the buffer output voltage in an easy and reliable manner.

A power switching device wherein the filter circuit comprises a filter capacitor, which is connected in series to a primary side winding of the transformer ensures a flexible and easy use and operation. The filter capacitor and the primary side winding build a filter of second order. Preferably, a filter resistor is connected in series to the series connection of the filter capacitor and the primary side winding. The series connection enables blocking of the direct component of the buffer output voltage.

A power switching device wherein the buffer circuit comprises at least one of a voltage amplifier and a current amplifier ensures a flexible and easy use and operation. By means of the buffer circuit the required power is provided without affecting the controller. Preferably, the buffer circuit is at least one of a Schmitt trigger or a totem pole pair.

A power switching device wherein a voltage stabilization circuit is connected upstream of the buffer circuit to the first input terminal ensures a flexible and easy use and operation. The voltage stabilization circuit ensures an essentially constant output voltage which is applied to the buffer circuit. Hence, the power switching device can be operated independent from the quality of the input voltage. For example, the voltage stabilization circuit is based on a Zener diode. Preferably, the voltage stabilization circuit comprises a regulator, for example a low-drop out regulator (LDO regulator).

A power switching device wherein the conditioning circuit is connected to the power switch such that at a first voltage level of the conditioning voltage a driving current charges an internal capacitance of the power switch and that at a second voltage level of the conditioning voltage the driving current discharges the internal capacitance of the power switch ensures an easy operation. Dependent on the voltage level the conditioning circuit controls the driving current and charges or discharges the internal capacitance of the power switch in order to switch on or switch off the power switch. Since the conditioning circuit uses the internal capacitance of the power switch no external capacitor is necessary to provide the driving voltage.

A power switching device comprising a protection circuit to detect an operation of the power switch in an undesired operation area ensures a flexible and easy use and operation. The protection circuit comprises at least one measuring element to measure at least one of a current and voltage of the power switch. Dependent on the current and/or voltage of the power switch the protection circuit detects whether the power switch is currently operated in a predefined undesired operation area. The protection circuit provides at least one of the protection features over current protection, short circuit protection and over temperature protection. Furthermore, voltage and current measurements can be used to calculate switching losses and to compare it to worst case conditions in order to detect excessive power losses and/or to provide over voltage protection.

A power switching device wherein the protection circuit comprises a protection switch to switch off the power switch when an operation in an undesired operation area is detected ensures a flexible and easy use and operation. The protection switch switches off the power switch when an operation in an undesired operation area is detected. Preferably, the protection switch is connected in parallel to an internal capacitance of the power switch such that the internal capacitance is discharged and the power switch is switched off when the protection switch is switched on. Preferably, the protection switch is a MOSFET.

A power switching device wherein the protection switch is connected in parallel to an internal capacitance of the power switch ensures a flexible and easy use and operation. When the protection switch is switched on the internal capacitance is discharged and the power switch is switched off. Preferably, the protection switch is designed as n-channel MOSFET. Preferably, a drain terminal of the protection switch is connected to a gate terminal of the power switch and a source terminal of the protection switch is connected to a source terminal of the power switch. Preferably, a control unit is connected to a gate terminal of the protection switch and provides a protection signal to the gate terminal.

A power switching device wherein the protection circuit comprises a control unit to provide a protection signal dependent on at least one of a power switch current and a power switch voltage ensures a flexible and easy use and operation. The protection circuit provides at least one of a power switch current and a power switch voltage to the control unit. Dependent on the power switch current and/or the power switch voltage the control unit compares an operation point of the power switch with at least one predefined undesired operation area. The control unit provides a protection signal when the operation point is within the at least one undesired operation area. The protection signal may be used as a warning signal and/or to switch off the power switch. For example, the control unit is designed as an IC, a microcontroller or a FPGA.

A power switching device wherein the transformer comprises a secondary side supply winding to provide a supply voltage to the protection circuit ensures a flexible and easy use and operation. An additional secondary side supply winding is coupled to the already existing transformer such that a supply voltage is provided to power up the protection circuit. The transformation ratio of the supply winding defines the required supply voltage. The protection circuit may comprise a stabilization circuit to stabilize the supply voltage and to provide an essentially constant input voltage to the control unit. The stabilization circuit comprises a diode, a Zener diode and a capacitor. The diode and the secondary side supply winding are connected in series such that the diode is connected to a node $N_4$ and the secondary side supply winding is connected to a node $N_3$. A flow direction of the diode is directed to the node $N_4$. The Zener diode and the capacitor are connected in parallel to the node $N_3$ and the node $N_4$. The anode of the Zener diode is connected to the node $N_3$ and the cathode of the Zener diode is connected to the node $N_4$.

Furthermore, it is an object of the present invention to provide a flexible and easy method to operate a power switching device.

This object is achieved by a method to operate a power switching device comprising the steps providing a power switching device according to the invention, applying an input voltage from a power stage to the first input terminal, applying a unipolar control voltage from a controller to the second input terminal, providing a unipolar buffer output voltage dependent on the input voltage and the unipolar control voltage by means of the buffer circuit, blocking a direct component of the unipolar buffer output voltage and providing an alternating primary side voltage by means of the filter circuit, transforming the alternating primary side voltage into an alternating secondary side voltage by means of the transformer, adding at least partially the blocked direct component to the alternating secondary side voltage and providing a unipolar conditioning voltage by means of the restoration circuit, and controlling the power switch dependent on the unipolar conditioning voltage by means of the conditioning circuit. The advantages of the method according to the invention correspond to the advantages of the power switching device according to the invention already described before.

The present invention is described in detail below with reference to the attached figures. The various features of novelty which characterize the invention are pointed out with particularity in the claims annexed to and forming a part of this disclosure. For a better understanding of the invention, its operating advantages and specific objects attained by its uses, reference is made to the accompanying drawings and descriptive matter in which preferred embodiments of the invention are illustrated.

DESCRIPTION OF THE PREFERRED EMBODIMENTS

Figure 1:
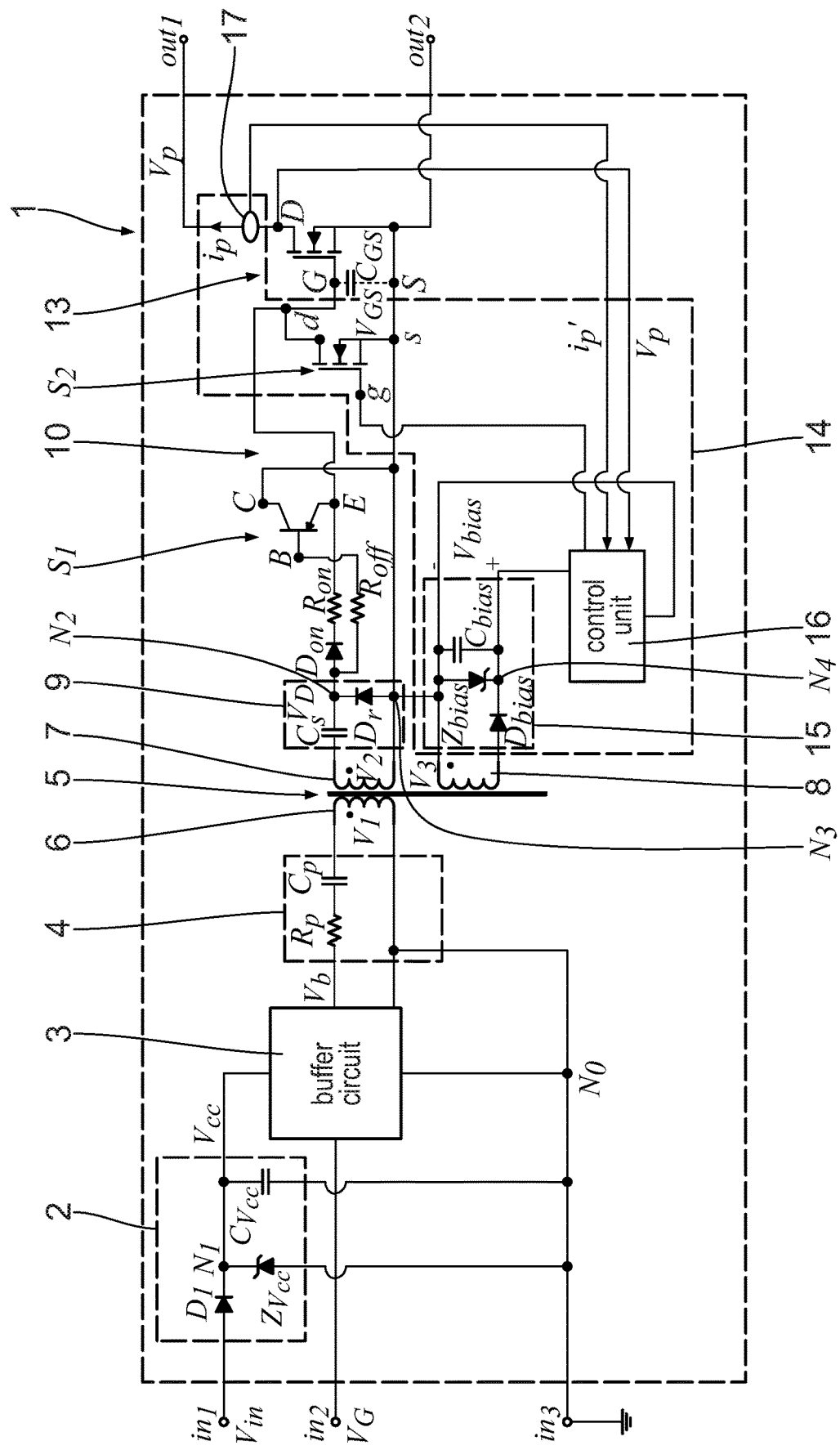
FIG. 1 is a schematic diagram of a power switching device.
Figure 2:
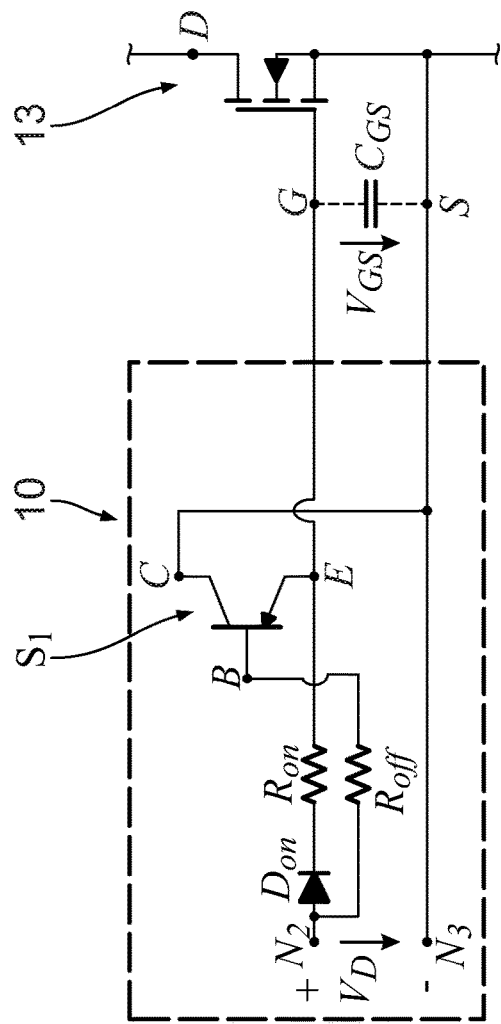
FIG. 2 is a schematic diagram of a conditioning circuit of the power switching device in FIG. 1.

FIG. 1 shows a power switching device 1 which is designed as a plug and play module. The power switching device 1 comprises three input terminals $in_1$, $in_2$ and $in_3$ and two output terminals $out_1$ and $out_2$. An input voltage $V_{in}$ from a power stage (not shown) is applied to the first input terminal $in_1$. A unipolar control voltage $V_G$ from a controller (not shown) is applied to the second input terminal $in_2$. The control voltage $V_G$ is preferably a PWM signal. A common ground of the power stage and the controller is applied to the third input terminal $in_3$.

The power switching device 1 comprises a voltage stabilization circuit 2 which is connected upstream of a buffer circuit 3 to the first input terminal $in_1$. The voltage stabilization circuit 2 comprises a diode $D_1$, a Zener diode $Z_{Vcc}$ and a capacitor $C_{Vcc}$. The diode $D_1$ is connected to the first input terminal $in_1$ and a first node $N_1$. A parallel connection of the Zener diode $Z_{Vcc}$ and the capacitor $C_{Vcc}$ is connected to the first node $N_1$ and a reference node $N_0$. The reference node $N_0$ is connected to the third input terminal $in_3$.

The first node $N_1$ is connected to the buffer circuit 3 such that the voltage stabilization circuit 2 provides a stabilized input voltage $V_{cc}$ to the buffer circuit 3. The second input terminal $in_2$ is connected to the buffer circuit 3 such that the buffer circuit 3 provides a unipolar buffer output voltage $V_b$ dependent on the stabilized input voltage $V_{cc}$ and the control voltage $V_G$. The buffer circuit 3 comprises at least one of a voltage amplifier and a current amplifier. For example, the buffer circuit 3 is designed as a Schmitt trigger or a totem pole pair. The buffer circuit 3 is connected to the reference node $N_0$. Due to the buffer circuit 3 the required power is provided by the power stage and the controller is not affected by the required power.

The buffer circuit 3 is connected to a filter circuit 4. The filter circuit 4 serves to block a direct component $V_{DC}$ of the buffer output voltage $V_b$ and to provide an alternating primary side voltage $V_1$. The filter circuit 4 comprises a filter resistor $R_P$ and a filter capacitor $C_P$ which are connected in series. The series connection of the filter resistor $R_P$ and the filter capacitor $C_P$ is connected to the buffer circuit 3 and a transformer 5. The series connection of the filter resistor $R_P$ and the filter capacitor $C_P$ is connected in series to a primary winding 6 of the transformer 5. The primary side winding 6 is further connected to the reference node $N_0$. Due to the series connection of the filter resistor $R_p$, the filter capacitor $C_p$ and the primary side winding 6 the filter circuit 4 acts as low-cut filter.

At the secondary side the transformer 5 is a secondary side winding 7 and a secondary side supply winding 8. The primary side winding 6 and the secondary side winding 7 define a first transformation ratio. The alternating primary side voltage $V_1$ is transformed to the secondary side such that the transformer 5 provides an alternating secondary side voltage $V_2$ dependent on the first transformation ratio. The transformer 5 isolates the primary side from the secondary side.

A restoration circuit 9 is connected to the secondary side winding 7. The restoration circuit 9 adds the blocked direct component $V_{DC}$ to the secondary side voltage $V_2$ and provides a unipolar conditioning voltage $V_D$ which is the input voltage of a conditioning circuit 10. The restoration circuit 9 comprises a restoration capacitor $C_S$ and a blocking element $D_r$. The restoration capacitor $C_S$ is connected in series to the secondary side winding 7. The series connection of the restoration capacitor $C_S$ and the secondary side winding 7 is connected to a second node $N_2$ and a third node $N_3$. The blocking element $D_r$ is connected to the second node $N_2$ and the third node $N_3$ such that it is connected in parallel to the series connection of the restoration capacitor $C_S$ and the secondary side winding 7. The blocking element $D_r$ is designed as a diode. The conditioning voltage $V_D$ is the voltage across the blocking element $D_r$.

The conditioning circuit 10 comprises a switch-on-circuit 11 and a switch-off-circuit 12. The switch-on-circuit 11 switches on a power switch 13 when the conditioning voltage $V_D$ has a first voltage level $V_{D1}$, whereas the switch-off-circuit 12 switches off the power switch 13 when the conditioning voltage $V_D$ has a second voltage level $V_{D2}$.

Figure 3:
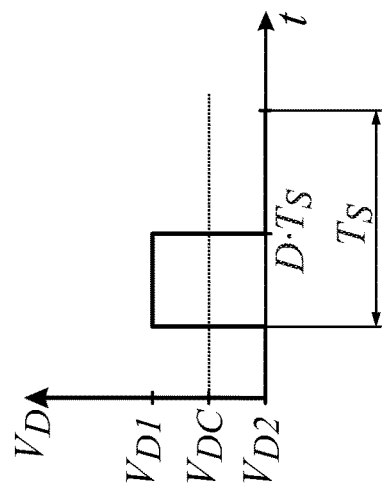
FIG. 3 is a time diagram of a conditioning voltage with a first voltage level and a second voltage level at the input of the conditioning circuit.

The conditioning voltage $V_D$ is shown in FIG. 3, wherein t denotes time. The conditioning voltage $V_D$ is due to the added direct component $V_{DC}$ unipolar and corresponds essentially to the control voltage $V_G$. Within a switching period $T_S$ the conditioning voltage $V_D$ has the first voltage level $V_{D1}$ for a time period of $D \cdot T_S$ and the second voltage level $V_{D2}$ for a time period of $(1-D) \cdot T_S$. D denotes the duty cycle of the power switch 13. The second voltage level $V_{D2}$ is essentially zero. The first voltage level $V_{D1}$ is positive.

The power switch 13 is designed as an n-channel MOSFET. A drain terminal D is connected to the first output terminal $out_1$, whereas a source terminal S is connected to the second output terminal $out_2$. The power switch 13 comprises a gate-source capacitance $C_{GS}$ between a gate terminal G and the source terminal S.

Figure 4:
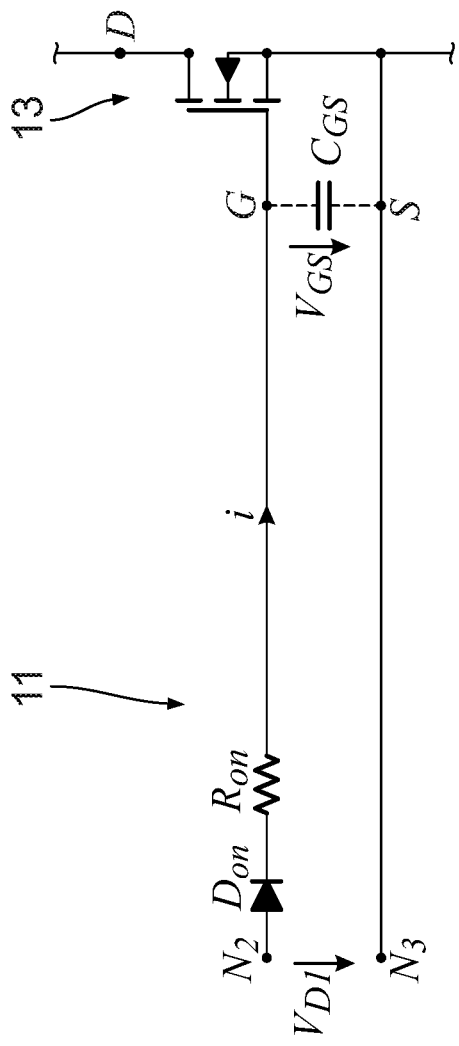
FIG. 4 is a view of an equivalent circuit of the conditioning circuit when the first voltage level is applied to the conditioning circuit.

The switch-on-circuit 11 comprises a blocking element $D_{on}$ and a resistor $R_{on}$, which are connected in series. The blocking element $D_{on}$ is a diode. The series connection of the blocking element $D_{on}$ and the resistor $R_{on}$ is connected to the second node $N_2$ and to the gate terminal G. The third node $N_3$ is connected to the source terminal S. When the conditioning voltage $V_D$ has the first voltage level $V_{D1}$ the switch-on-circuit 11 provides a driving current i which charges the gate-source capacitance $C_{GS}$ and provides a driving voltage $V_{GS}$ that switches on the power switch 13. This is shown in FIG. 4.

Figure 5:
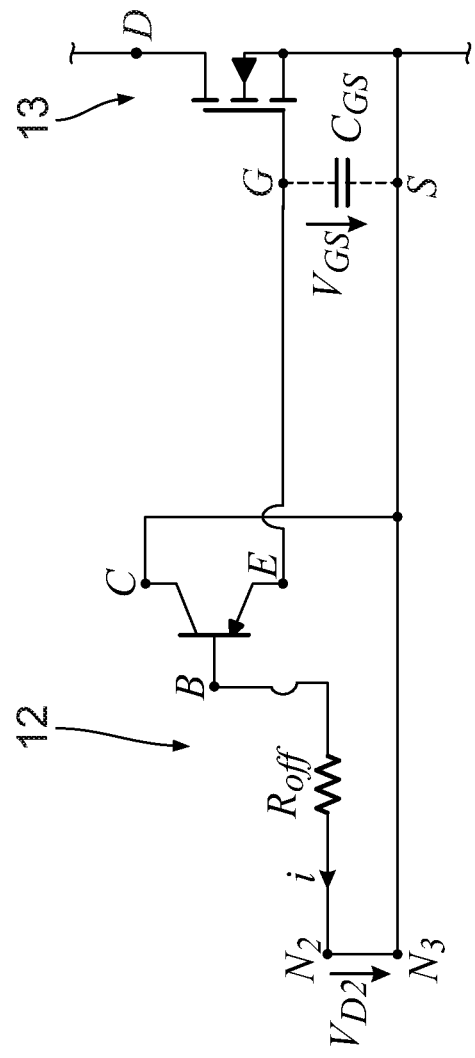
FIG. 5 is a view of an equivalent circuit of the conditioning circuit when the second voltage level is applied to the conditioning circuit.

The switch-off-circuit 12 comprises a control switch $S_1$. The control switch $S_1$ is designed as a bipolar junction transistor. Preferably, the bipolar junction transistor is a PNP bipolar junction transistor. A collector terminal C of the control switch $S_1$ is connected to the source terminal S, whereas an emitter terminal E of the control switch $S_1$ is connected to the gate terminal G. A bias terminal B of the control switch $S_1$ is connected to a resistor $R_{off}$ which is connected to the second node $N_2$. When the conditioning voltage $V_D$ has the second voltage level $V_{D2}$, namely essentially zero, the switch-on-circuit 11 is blocked by the diode $D_{on}$ and the control switch $S_1$ is switched on due to the driving voltage $V_{GS}$ and a current via the emitter terminal E and the bias terminal B. The control switch $S_1$ acts as a short circuit such that the gate-source-capacitance $C_{GS}$ is discharged by a driving current i and the power switch 13 is switched off. The switch-off-circuit 12 is shown in FIG. 5.

Furthermore, the power switching device 1 comprises a protection circuit 14 in order to detect whether the power switch 13 is operated in an undesired operation area. The secondary side supply winding 8 provides a supply voltage $V_3$ which is used for power supply of the protection circuit 14. The primary side winding 6 and the secondary side supply winding 8 define a second transformation ratio which depends on the required supply voltage $V_3$. The protection circuit 14 comprises a stabilization circuit 15 which provides a stabilized supply voltage $V_{bias}$. The stabilized supply voltage $V_{bias}$ is applied to a control unit 16.

The stabilization circuit 15 comprises a diode $D_{bias}$, a Zener diode $Z_{bias}$ and a capacitor $C_{bias}$. The diode $D_{bias}$ and the secondary side supply winding 8 are connected in series. The secondary side supply winding 8 is connected to the third node $N_3$. The diode $D_{bias}$ is connected to a fourth node $N_4$. The Zener diode $Z_{bias}$ and the capacitor $C_{bias}$ are connected in parallel to the third node $N_3$ and the fourth node $N_4$. Hence, the control unit 16 shares the same ground as the power switch 13.

The protection circuit 14 comprises a measuring element 17 to measure a power switch current $i_P$. The measured power switch current $i_P$, is provided to the control unit 16. Furthermore, a power switch voltage $V_p$ is provided to the control unit 16. The power switch voltage $V_P$ is in particular the drain-source-voltage of the power switch 13. Dependent on the power switch current $i_P$, and/or the power switch voltage $V_P$ the control unit 16 determines whether the power switch 13 is operated within an undesired operation area or not. In case the power switch 13 is operated within an undesired operation area the control unit 16 creates a protection signal p. The protection signal p is in particular a voltage signal.

The protection circuit 15 comprises a protection switch $S_2$ which serves to switch off the power switch 13 in case that the power switch 13 is operated within an undesired operation area. The protection switch $S_2$ is connected in parallel to the gate-source-capacitance $C_{GS}$. The protection switch $S_2$ provides a short circuit to the gate-source-capacitance $C_{GS}$ in case it is switched on.

The protection switch $S_2$ is designed as an n-channel MOSFET. A drain terminal d of the protection switch $S_2$ is connected to the gate terminal G, whereas a source terminal s of the protection switch $S_2$ is connected to the source terminal S. The control unit 16 is connected to a gate-terminal g of the protection switch $S_2$ and provides the protection signal p to the gate terminal g.

The power switching device 1 acts as a plug and play module and can be used for many applications where the source terminal S of the power switch 13 is connected to a fixed voltage or a floating voltage. The power switching device 1 omits the effort usually needed to design properly driving and conditioning scheme for switches that have floating sources such as switches utilized in isolated topologies, conventional non-isolated topologies with floating source-power devices or topologies with an unconventional way of connecting power devices. The power switching device 1 can be powered up using a power stage even if it is used in isolated topology. Real-life examples of potential applications are isolated topologies such as flyback, flybuck, forward, push-pull, half bridge and full bridge and also, non-isolated topologies which have a high side switch or floating source-switch, such as buck, boost and buck-boost converters. Using the power switching device 1 solves the problem of driving and conditioning since the device 1 or many of them connected in every possible way in a circuit topology, can be easily driven using the same controller that shares the same power stage ground without building dedicated power supply for each switch 13. Furthermore, the power switching device 1 provides different protection features such as over current protection, short circuit protection and over temperature protection.

The power switching device 1 is capable of working regardless of the source connection of the power switch 13 since it uses the transformer 5 to provide an isolated differential gate-source voltage $V_{GS}$ that is positive when it is desired to turn on the power switch 13 or an almost zero voltage when it is desired to turn off the power switch 13. The power switching device 1 can be operated with a bipolar or a unipolar control voltage $V_G$. Preferably, the controller can only generate a unipolar control voltage $V_G$, namely a positive or negative voltage, with respect to the ground. Hence, the power switching device 1 needs an isolation or dedicated power supply to provide the required driving voltage $V_{GS}$. Due to the buffer circuit 3 the required power is provided by the power stage and the controller is not affected by the required power. The voltage stabilization circuit 2 can be designed as low-drop out regulator (LDO). The filter circuit 4 blocks the direct component $V_{DC}$ in the unipolar buffer output voltage $V_b$ such that the resulting alternating primary side voltage $V_1$ is transformed into the alternating secondary side voltage $V_2$. The restoration circuit 9 restores the blocked direct component $V_{DC}$ according to the transformation ratio of the transformer 5. Due to the restoration circuit 9 the level of the driving voltage $V_{GS}$ is not dependent on the duty cycle D. The blocking element or diode $D_r$ is used to block the negative part of the secondary side voltage $V_2$ and to reduce the gate driving losses. The blocking element or diode $D_{on}$ and the resistor $R_{on}$ are used to charge the gate-source capacitance $C_{GS}$ and to turn the power switch 13 on when the control voltage $V_G$ is high, whereas the control switch $S_1$ (PNP bipolar junction transistor) is used to discharge the gate-source capacitance $C_{GS}$ and to turn off the power switch 13 when the control voltage $V_G$ is low. The power switching device 1 works with a power switch 13 that is designed as MOSFET, bipolar junction transistor or IGBT since all of these power switches 13 require a differential driving signal with respect to its source terminal or emitter terminal.

Additionally, the power switching device 1 provides different protection features. Since the control unit 16 shares the same ground as the power switch 13, the current and voltage information can be fed directly to it. Since the power switch current $i_p$ and the power switch voltage $V_p$ are available, over current protection, short circuit protection and over temperature protection can be provided by calculating undesired operation areas and safe operation areas. Additionally, switch power losses and temperature rise can be calculated and estimated. Furthermore, voltage and current measurements can be used to calculate switching losses and to compare it to worst case conditions in order to detect excessive power losses and/or to provide over voltage protection. When any violation of the safe operation is detected, the control unit 16 produces a protection signal p, namely a high gating pulse to the protection switch $S_2$ such that the power switch 13 is turned off and hence protected.

While specific embodiments of the invention have been shown and described in detail to illustrate the application of the principles of the invention, it will be understood that the invention may be embodied otherwise without departing from such principles.

The invention claimed is:

1. A power switching device, comprising:
a first input terminal to receive an input voltage from a power stage;
a second input terminal to receive a control voltage from a controller;
a buffer circuit to provide a buffer output voltage dependent on the input voltage and the control voltage;
a filter circuit to block a direct component of the buffer output voltage and to provide a primary side voltage;
a transformer to transform the primary side voltage into a secondary side voltage;
a restoration circuit to at least partially add the blocked direct component to the secondary side voltage and to provide a unipolar conditioning voltage, the restoration circuit comprising a blocking element, which is a diode connected in parallel to a series connection of a secondary side winding of the transformer and a restoration capacitor;
a conditioning circuit, comprising exactly one control switch, to provide a driving signal dependent on the unipolar conditioning voltage; and
a power switch connected to a first output terminal and a second output terminal, which is controlled by the driving signal, wherein a switch-on-circuit is part of the conditioning circuit and the switch-on-circuit comprises a blocking element, which is a diode and allows a flow of a driving current such that the power switch is switched on when the unipolar conditioning voltage has a first voltage level, wherein a switch-off-circuit is part of the conditioning circuit and the switch-off-circuit comprises the exactly one control switch, which allows a flow of the driving current such that the power switch is switched off when the unipolar conditioning voltage has a second voltage level, the conditioning circuit being connected to the power switch such that a charged internal capacitance of the power switch provides a first level of a driving voltage such that the power switch is switched on and the discharged internal capacitance provides a second level of the driving voltage such that the power switch is switched off.

2. The power switching device according to claim 1, wherein the filter circuit comprises a filter capacitor and a filter resistor.

3. The power switching device according to claim 1, wherein the filter circuit comprises a filter capacitor, which is connected in series to a primary side winding of the transformer.

4. The power switching device according to claim 1, wherein the buffer circuit comprises at least one of a voltage amplifier and a current amplifier.

5. The power switching device according to claim 1, wherein a voltage stabilization circuit is connected upstream of the buffer circuit to the first input terminal.

6. The power switching device according to claim 1, wherein the conditioning circuit is connected to the power switch such that at the first voltage level of the unipolar conditioning voltage the driving current charges the internal capacitance of the power switch and at the second voltage level of the unipolar conditioning voltage the driving current discharges the internal capacitance of the power switch.

7. The power switching device according to claim 1, further comprising:
    a protection circuit to detect an operation of the power switch in an undesired operation area.

8. The power switching device according to claim 7, wherein the protection circuit comprises a protection switch to switch off the power switch when the operation in an undesired operation area is detected.

9. The power switching device according to claim 8, wherein the protection switch is connected in parallel to the internal capacitance of the power switch.

10. The power switching device according to claim 7, wherein the protection circuit comprises a control unit to provide a protection signal dependent on at least one of a power switch current and a power switch voltage.

11. The power switching device according to claim 7, wherein the transformer comprises a secondary side supply winding to provide a supply voltage to the protection circuit.

12. The power switching device according to claim 1, wherein the filter circuit comprises a filter capacitor and a filter resistor, which are connected in series.

13. The power switching device according to claim 1, wherein the switch-on-circuit has no control switch.

14. A method to operate a power switching device, the method comprising the following steps:
    providing a power switching device comprising:
        a first input terminal to receive an input voltage from a power stage;
        a second input terminal to receive a control voltage from a controller;
        a buffer circuit to provide a unipolar buffer output voltage dependent on the input voltage and the control voltage;
        a filter circuit to block a direct component of the buffer output voltage and to provide a primary side voltage;
        a transformer to transform the primary side voltage into a secondary side voltage;
        a restoration circuit to at least partially add the blocked direct component to the secondary side voltage and to provide a unipolar conditioning voltage, the restoration circuit comprising a blocking element, which is a diode connected in parallel to a series connection of a secondary side winding of the transformer and a restoration capacitor;
        a conditioning circuit to provide a driving signal dependent on the unipolar conditioning voltage, wherein the conditioning circuit comprises exactly one control switch; and
        a power switch connected to a first output terminal and a second output terminal, which is controlled by the driving signal, wherein a switch-on-circuit is part of the conditioning circuit and the switch-on-circuit comprises a blocking element, which is a diode and allows a flow of a driving current such that the power switch is switched on when the unipolar conditioning voltage has a first voltage level, wherein a switch-off-circuit is part of the conditioning circuit and the switch-off-circuit comprises the exactly one control switch, which allows a flow of the driving current such that the power switch is switched off when the unipolar conditioning voltage has a second voltage level, the conditioning circuit being connected to the power switch such that a charged internal capacitance of the power switch provides a first level of a driving voltage such that the power switch is switched on and the discharged internal capacitance provides a second level of the driving voltage such that the power switch is switched off;
    applying the input voltage from the power stage to the first input terminal;
    applying a unipolar control voltage from the controller to the second input terminal;
    providing the unipolar buffer output voltage dependent on the input voltage and the unipolar control voltage via the buffer circuit;
    blocking the direct component of the unipolar buffer output voltage and providing an alternating primary side voltage via the filter circuit;
    transforming the alternating primary side voltage into an alternating secondary side voltage via the transformer;
    adding at least partially the blocked direct component to the alternating secondary side voltage and providing the unipolar conditioning voltage via the restoration circuit; and
    controlling the power switch dependent on the unipolar conditioning voltage via the conditioning circuit.

15. The power shifting device according to claim 14, wherein the switch-on-circuit is free of a control switch.

16. A power switching device, comprising:
    a first input terminal configured to receive an input voltage from a power stage;
    a second input terminal configured to receive a control voltage from a controller;
    a buffer circuit configured to provide a buffer output voltage based on the input voltage and the control voltage;
    a filter circuit configured to block a direct component of the buffer output voltage and the filter circuit being configured to provide a primary side voltage;

a transformer configured to transform the primary side voltage into a secondary side voltage;

a restoration circuit configured to at least partially add the blocked direct component to the secondary side voltage and the restoration circuit being configured to provide a unipolar conditioning voltage, the restoration circuit comprising a blocking element, the restoration circuit comprising a diode connected in parallel to a series connection of a secondary side winding of the transformer and a restoration capacitor, the conditioning circuit having only one control switch;

a conditioning circuit configured to provide a driving signal dependent on the unipolar conditioning voltage; and a power switch connected to a first output terminal and a second output terminal, the power switch being controlled via the driving signal, wherein a switch-on-circuit is part of the conditioning circuit and the switch-on-circuit comprises a blocking element, the blocking element comprising a diode and the blocking element allowing a flow of a driving current such that the power switch is switched on when the unipolar conditioning voltage has a first voltage level, wherein a switch-off-circuit is part of the conditioning circuit and the switch-off-circuit comprises the only one control switch, the only one control switch allow a flow of the driving current such that the power switch is switched off when the unipolar conditioning voltage has a second voltage level, the conditioning circuit being connected to the power switch such that a charged internal capacitance of the power switch provides a first level of a driving voltage such that the power switch is switched on and the discharged internal capacitance provides a second level of the driving voltage such that the power switch is switched off.

17. The power switching device according to claim 16, wherein the switch-on-circuit has no control switch.

18. The power switching device according to claim 16, wherein the filter circuit comprises a filter capacitor and a filter resistor.

19. The power switching device according to claim 16, wherein the filter circuit comprises a filter capacitor, which is connected in series to a primary side winding of the transformer.

20. The power switching device according to claim 16, wherein the buffer circuit comprises at least one of a voltage amplifier and a current amplifier.

\* \* \* \* \*